United States Patent [19]
Seki et al.

[11] Patent Number: 4,976,573
[45] Date of Patent: Dec. 11, 1990

[54] APPARATUS FOR CHAMFERING PLANAR PLATE

[75] Inventors: Kamehru Seki; Isamu Kubo, both of Saitama, Japan

[73] Assignee: Nippon CMK, Corp., Japan

[21] Appl. No.: 292,895

[22] Filed: Jan. 3, 1989

[30] Foreign Application Priority Data

Mar. 23, 1988 [JP] Japan ................................. 63-68677

[51] Int. Cl.⁵ ............................................... B23C 3/12
[52] U.S. Cl. ...................................... 409/138; 83/869; 409/303
[58] Field of Search ............... 409/138, 303, 131, 132, 409/193, 195, 198, 207; 83/837, 869; 144/136 R, 150, 368, 371; 51/283 E; 156/153, 154, 267, 268, 353; 29/829, 846

[56] References Cited

U.S. PATENT DOCUMENTS

| 2,703,511 | 3/1955 | Griner | 409/198 |
| 3,749,625 | 7/1973 | Berg | 144/371 X |
| 4,462,147 | 7/1984 | Herb et al. | 409/132 X |
| 4,643,237 | 2/1987 | Rosa | 144/368 X |
| 4,718,202 | 1/1988 | Worsham | 51/283 E |

FOREIGN PATENT DOCUMENTS 1271678 11/1986 U.S.S.R. ............................. 409/138

Primary Examiner—Steven C. Bishop
Attorney, Agent, or Firm—Bruce L. Adams; Van C. Wilks

[57] ABSTRACT

An apparatus for chamfering the outer edges of stacked printed circuit boards comprises a detecting device for detecting the boundary between two adjacent boards, and a chamfering tool positionable adjacent to the opposed outer edges of respective ones of the two adjacent boards in response to detection of the boundary and movable along the board outer edges to simultaneously chamfer both outer edges. The chamfering tool successively chamfers pairs of opposed outer edges in the upward direction on one side of the stack, and then the stack is turned so that the chamfering tool chamfers the outer edges on a different side of the stack printed circuit boards.

15 Claims, 4 Drawing Sheets

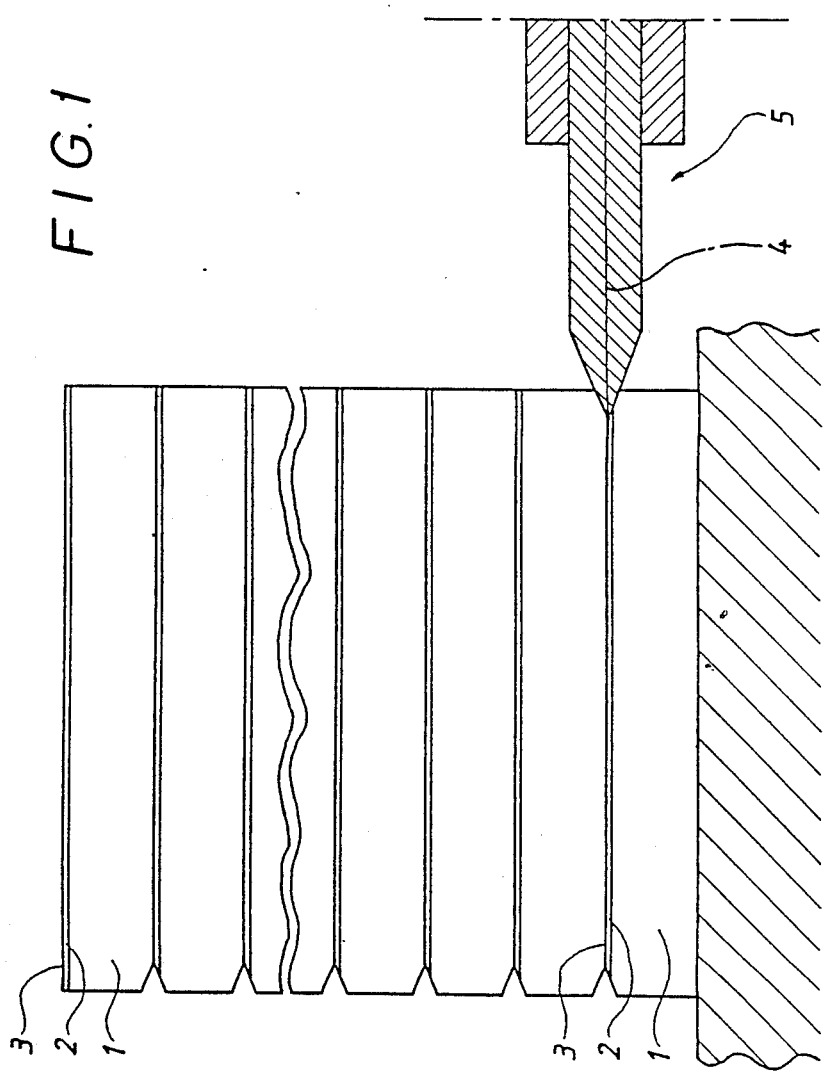

F I G. 3
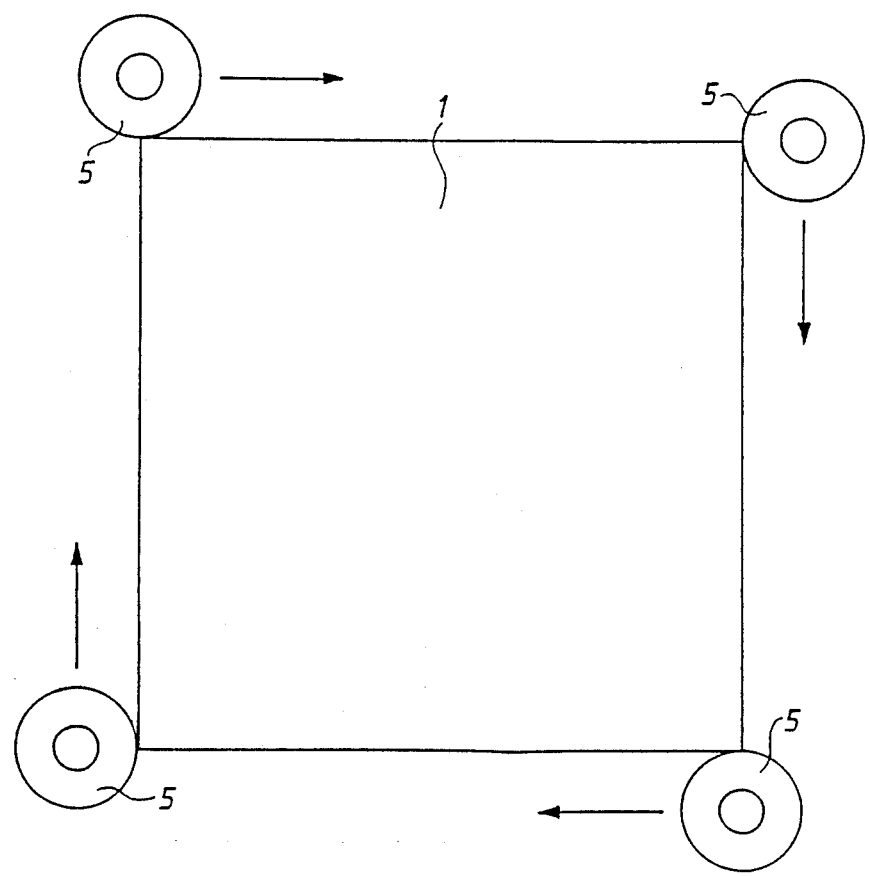

APPARATUS FOR CHAMFERING PLANAR PLATE

BACKGROUND OF THE INVENTION

The present invention relates generally to an apparatus for chamfering the edges of a planar plate. The present invention has been developed to chamfer the edges of a printed wiring board as one of the manufacturing process steps thereof. However, the apparatus can be utilized for chamfering planar plates in general.

Conventional planar plates are chamfered one by one. Namely, one plate is positioned correctly on a chamfering table and a tool chamfers the four edges on one side of the plate, and then the plate is reversed and the same process is repeated to chamfer the edges on the reverse side of the plate.

Such a conventional process is time consuming as the plate must be positioned accurately on a table, especially when the chamfering tool is guided automatically. Basically, four edges on one side of the plate are first chamfered and then the plate must be inverted to chamfer edges on the other side of the plate so that the conventional automatic chamfering apparatus is very difficult and time consuming to operate, especially when the plate to be chamfered is thin because positioning of a thin plate is difficult.

Consequently, conventional chamfering apparatus suffer the disadvantages of difficulties in maintaining an accurate working plane, inaccurate positioning and warping of the plates, and damage to the plates caused by the chamfering tools. Thus ordinary chamfering is time consuming and results in poor productivity.

SUMMARY OF THE INVENTION

An object of the present invention is to eliminate or at least mitigate the above-mentioned disadvantages and to provide an improved apparatus for chamfering planar plates wherein the chamfering process is performed on a plurality of stacked plates so that positioning errors and warp problems are effectively eliminated.

According to the present invention, the chamfering apparatus comprises means to stack a plurality of planar plates, means to detect the border between adjacent plates, and working tool means relatively movable along the stacked surface of the plates and workable along the edges thereof in response to detection of the border.

The working tool means preferably comprises a V-shaped cutting tool, and the detecting means preferably comprises a CCD camera or a proximate sensor to detect the presence of a copper film on one or both surfaces of the plates.

As the plates are stacked, positioning of the plates is done once and no inverting process is necessary. As the border between each two adjacent stacked plates is detected precisely, the cutting tool can be accurately guided and the edges to be chamfered are accurately determined. As the cutting tool has a V-shape, no reversing of the tool is needed. The apparatus performs accurate chamfering in a very short time period even if the plates have different thicknesses.

A conventional chamfering process takes about 3–5 seconds per plate and the chamfer result is not sufficient. Whereas, the apparatus of present invention can perform sufficiently accurate chamfering in about ⅓ of the time.

BRIEF DESCRIPTION OF THE DRAWINGS

FIG. 1 is a schematic side view, a portion of which is broken away, of a part of a chamfering apparatus according to one embodiment of the present invention, FIG. 3 is a plan view similar to FIG. 2 but showing four working tools.

DETAILED DESCRIPTION OF THE PREFERRED EMBODIMENT

One embodiment of chamfering apparatus according to the present invention will be described with reference to chamfering plates in the nature of printed wiring boards, it being understood that the chamfering apparatus can also be used to chamfer any desired kinds of plates.

The chamfering apparatus includes a stacking device, an aligning device, a border detecting device, a chamfering device, a turning device and a discharge device.

The stacking device stacks a plurality, e.g. 10 to 250, base plates which are cut by a cutting machine. The stacked plates are transported to the aligning device where the plates are pushed from both sides to be parallel to one another and are pushed from the top to maintain their stacked state and are supplied to the chamfering device. At the chamfering device, the border detecting device detects the border between adjacent plates by means of a CCD camera or a proximate sensor for detecting the copper film which covers the printed wiring board.

The chamfering device utilizes a numerical control positioning device to move a V-shaped tool to align the tool precisely to the detected border and to compensate or correct for the copper film thickness of 17–35 $\mu$m so that the center of the tool precisely aligns with the center of the border. Then the cutter moves along the border, cutting the lower edge of the uper plate and the upper edge of the lower plate by one movement or pass of the cutter.

Figure 4:
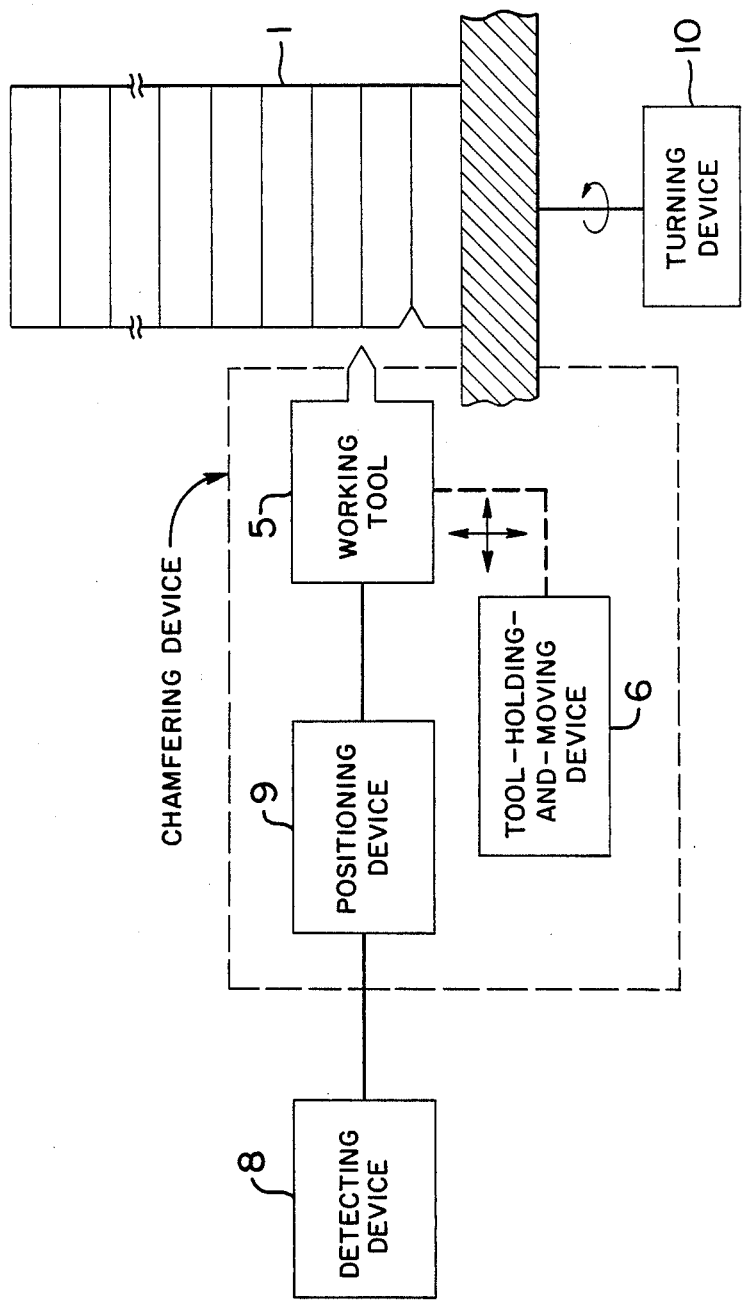
FIG. 4 is a schematic view of the main parts of the chamfering apparatus.

The chamfering apparatus, as shown in FIGS. 1 and 4, acts on a stack of base plates 1 which, in this embodiment, each have a copper film 2 on one major surface thereof. A detecting device 8, such as a CCD camera or a sensor for detecting the copper film 2 which covers one face of the base plates 1, detects the boundary between two adjacent base plates 1 and coacts with a positioning device 9 to position a rotary cutting tool 5 so that the center line 4 of the cutting edge thereof is aligned with a border line 3 which defines the boundary between the two adjacent plates. Then a tool-holding-and-moving device 6 effects movement of the cutting tool 5 along the opposed outer edges of the two adjacent plates 1 while rotating the tool 5 to thereby simultaneously chamfer the plate edges during one stroke or pass of the cutting tool 5. The cutting tool 5 has a conically tapered cutting edge having an included angle which may be between 45–90° so as to make any desired chamfer angle and depth of cut. The chamfer cutting begins at the lowest pair of adjacent plates, and the procedure is repeated working upwardly for each successive pair of adjacent plates in the stack. In the event both major surfaces of the base plates 1 are covered with the copper film 2, there is no need to correct or compensate for the copper film thickness when aligning the cutting tool 5 with the border line 3.

Figure 2A:
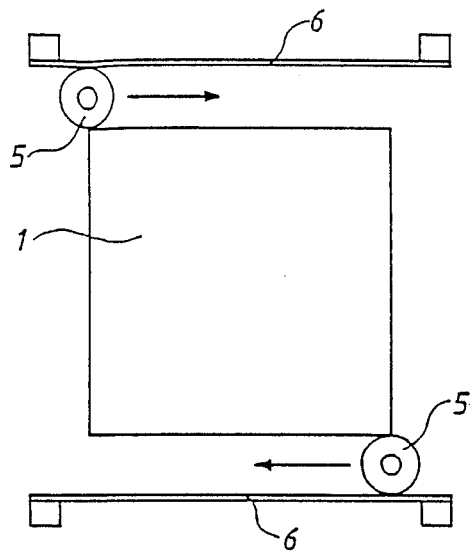
FIGS. 2A, 2B and 2C are plan views showing different arrangements of stacked plates and working tools.
Figure 2B:
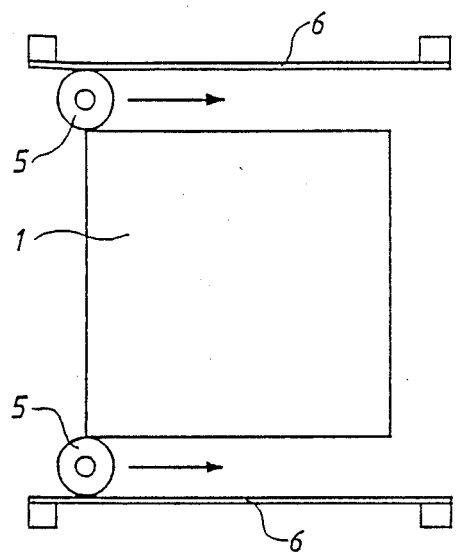
Figure 2C:
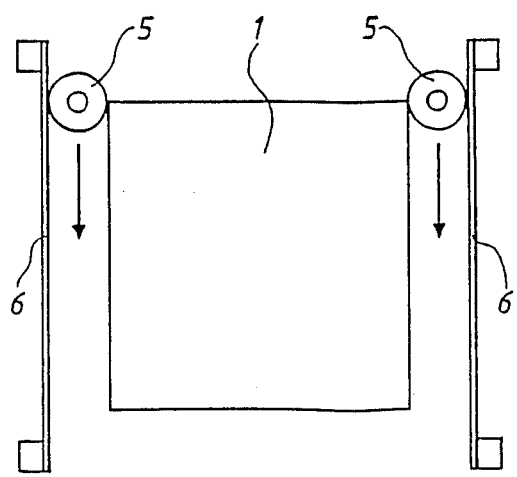

When the chamfer cutting reaches the uppermost plate, a turning device 10 turns the stack of plates at 90° to face the cutting tool 5 adjacent another side of the stack of plates 1. As shown in FIG. 2, when two sets of tools 5 are used, one turning is sufficient to chamfer four edges of the plates, and when four sets of tools 5 are utilized as shown in FIG. 3, no turning is necessary to complete the chamfering. In this case, 250 plates can be chamfered in about 5 minutes. The tool-holding-and-moving device 6 is shown in FIG. 2.

After complete chamfering of eight edges of the plates, the base plates are conveyed to a discharge device (not shown) where the plates are prepared for the next process which is not related to the present invention.

In the drawings, a rotary cutter is used to perform a 45° chamfer. Other desired tools, e.g. an end mill tool, can be used to perform a 90° chamfer. The angle and depth of the chamfer can be selected as desired.

The present invention has been described in connection with chamfering stacked printed wiring boards as a preferred embodiment. Non-metallic plates having metal films can be chamfered by the same apparatus. Other plates can be chamfered by utilizing a suitable border detecting device having the desired accuracy.

As described, by chamfering the plates in stacked condition, production efficiency is remarkably improved. The plates are maintained flat so that warp or incorrect chamfer is not produced.

We claim:

1. An apparatus for chamfering the edges of stacked plates, comprising: detecting means comprising a CCD camera for detecting the boundary between two adjacent stacked plates in a stack of plates; and chamfering means positionable adjacent to opposed outer edges of respective ones of the two adjacent stacket plates in response to detection of the boundary and relatively movable along the opposed outer edges for simultaneously chambering both opposed edges.

2. An apparatus according to claim 1; wherein the chambering means comprises a rotary working tool having a tapered cutting edge.

3. An apparatus according to claim 2; wherein the rotary working tool comprises a rotary cutting tool.

4. An apparatus according to claim 3; wherein the rotary cutting tool has a conically tapered cutting edge.

5. An apparatus according to claim 1; including a turning device supporting thereon the stacket plates for turning the stacket plates relative to the chamfering means to position the chamfering means adjacent different opposed edges of the two plates.

6. An apparatus according to claim 1; including in combination therewith a stack of plates comprised of printed circuit boards, whereby the apparatus is used to chamfer the edges of the printed circuit boards.

7. An apparatus for chamfering the edges of stacked plates, comprising: detecting means for detecting the boundary between two adjacent stacked plates in a stack of plates, the detecting means comprising a sensor for detecting the presence of a metal film on the major surface of one of the two adjacent stacked plates; and chamfering means positionable adjacent to opposed outer edges of respective ones of the two adjacent stacked plates in response to detection of the boundary and relatively movable along the opposed outer edges for simultaneously chamfering both opposed edges.

8. An apparatus according to claim 7; wherein the chamfering means comprises a working tool, and a positioning device for positioning the working tool adjacent opposed edges of respective ones of the two adjacent stacked plates in response to detection of the boundary.

9. An apparatus according to claim 8; wherein the working tool has a center line and the two adjacent stacked plates have a border line defining the boundary between the two plates, and the positioning device includes means responsive to detection of the boundary for positioning the working tool so that the center line thereof is aligned with the border line between two plates.

10. An apparatus according to claim 9; wherein the positioning device includes numerical control means for compensating for the thickness of a metal film on the major surface of one of the two plates to thereby enable the center line of the working tool to be aligned with the border line between the two plates.

11. An apparatus according to claim 7; including a turning device supporting thereon the stacked plates for turning the stacked plates relative to the chamfering means to position the chamfering means adjacent different opposed edges of the two plates.

12. An apparatus according to claim 7; including in combination therewith a stack of plates comprised of printed circuit boards, whereby the apparatus is used to chamfer the edges of the printed circuit boards.

13. An apparatus according to claim 7; wherein the chamfering means comprises a rotary working tool having a tapered cutting edge.

14. An apparatus according to claim 7; wherein the rotary working tool comprises a rotary cutting tool.

15. An apparatus according to claim 14; wherein the rotary cutting tool has a conically tapered cutting edge.

* * * * *